(12) United States Patent
Tsuchida et al.

(10) Patent No.: US 8,189,363 B2
(45) Date of Patent: May 29, 2012

(54) RESISTANCE CHANGE MEMORY

(75) Inventors: Kenji Tsuchida, Kawasaki (JP);
Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/543,793

(22) Filed: Aug. 19, 2009

(65) Prior Publication Data
US 2010/0046274 A1 Feb. 25, 2010

(30) Foreign Application Priority Data

Aug. 20, 2008 (JP) .................................. 2008-211901

(51) Int. Cl.
G11C 11/00 (2006.01)
G11C 7/02 (2006.01)
(52) U.S. Cl. ...................... 365/148; 365/158; 365/210.1
(58) Field of Classification Search .................. 365/148, 365/158, 210.1, 210.15, 230.03
See application file for complete search history.

(56) References Cited

U.S. PATENT DOCUMENTS

| | | | | |
|---|---|---|---|---|
| 6,721,198 B2 * | 4/2004 | Kang | ............................ | 365/145 |
| 6,809,976 B2 | 10/2004 | Ooishi | | |
| 7,221,585 B2 * | 5/2007 | Bessho | .......................... | 365/173 |
| 2002/0154531 A1 * | 10/2002 | Lowrey et al. | .................. | 365/100 |
| 2008/0002483 A1 * | 1/2008 | Rinerson et al. | .......... | 365/189.09 |
| 2008/0158936 A1 * | 7/2008 | Bertin et al. | .................... | 365/148 |
| 2009/0027952 A1 * | 1/2009 | Kang et al. | ...................... | 365/163 |

OTHER PUBLICATIONS

Background Art Information.
Explanation of Non-English Language Reference.

* cited by examiner

*Primary Examiner* — Anh Phung
*Assistant Examiner* — Khamdan Alrobaie
(74) *Attorney, Agent, or Firm* — Knobbe, Martens, Olson & Bear, LLP

(57) ABSTRACT

A resistance change memory includes two memory cell arrays each including a plurality of memory cells, the memory cells including variable resistive elements, two reference cell arrays provided to correspond to the two memory cell arrays, respectively, and each including a plurality of reference cells, the reference cells having a reference value, and a sense amplifier shared by the two memory cell arrays and detecting data in an accessed memory cell by use of a reference cell array corresponding to a second memory cell array different from a first memory cell array including the accessed memory cell. In reading the data, a particular reference cell in one reference cell array is always activated for an address space based on one memory cell array as a unit.

22 Claims, 7 Drawing Sheets

Parallel state (low resistance)

Antiparallel state (high resistance)

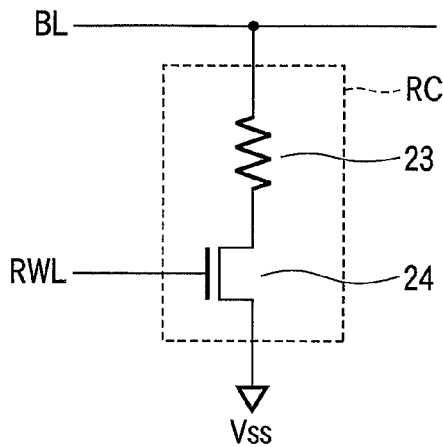
F I G. 6
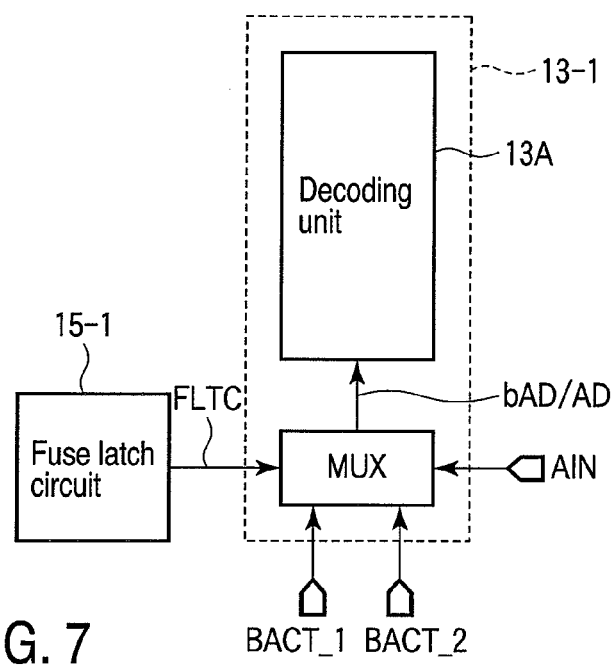
F I G. 7
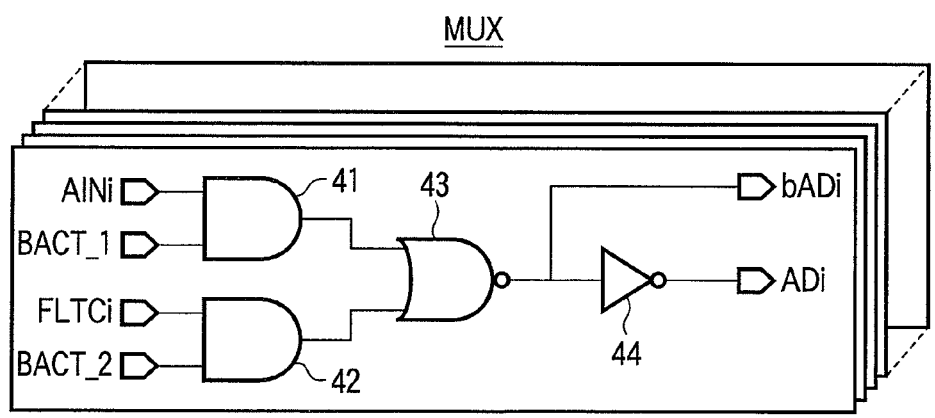
F I G. 8

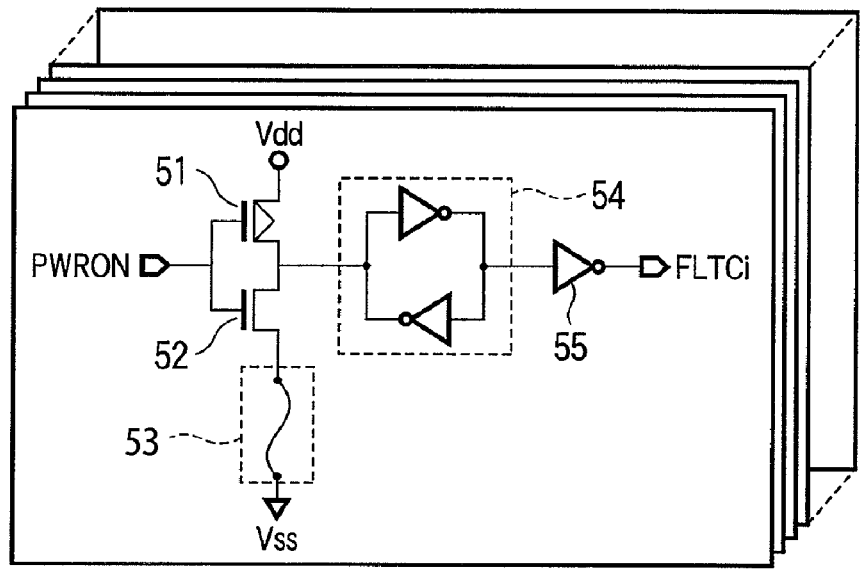
F I G. 9
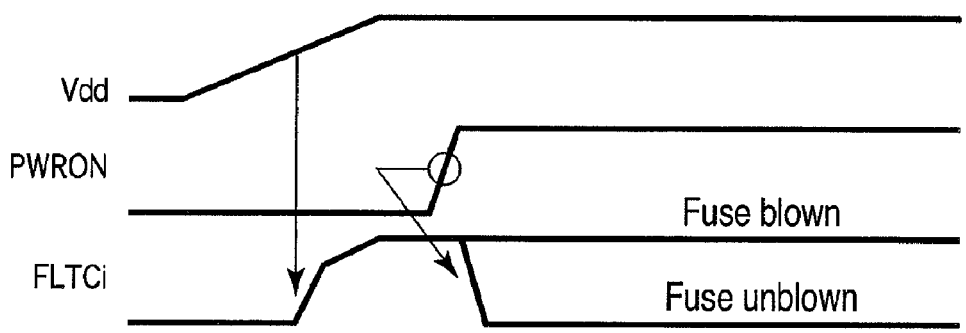
F I G. 10

RESISTANCE CHANGE MEMORY

CROSS-REFERENCE TO RELATED APPLICATIONS

This application is based upon and claims the benefit of priority from prior Japanese Patent Application No. 2008-211901, filed Aug. 20, 2008, the entire contents of which are incorporated herein by reference.

BACKGROUND OF THE INVENTION

1. Field of the Invention

The present invention relates to a resistance change memory, such as a resistance change memory comprising a variable resistive element which changes its resistance in accordance with stored data.

2. Description of the Related Art

A magnetic random access memory (MRAM) is known as one kind of a resistance change memory. The MRAM is a device which performs memory operation by using a magnetoresistive effect to store "1" or "0" information in a memory cell. The MRAM is ranked as one of candidate universal memory devices achieving nonvolatility, high integration properties, high reliability, lower power consumption properties and high-speed operation.

There have been reported a great number of MRAMs using elements that show the tunneling magnetoresistive (TMR) effect among the magnetoresistive effects. As a TMR effect element, a magnetic tunnel junction (MTJ) element is generally used. This MTJ element has a stacked structure including two ferromagnetic layers and an insulating layer interposed between the ferromagnetic layers, and utilizes the change of magnetic resistance caused by a spin-polarized tunnelling effect.

Data can be read from the MRAM using the MTJ element as follows: A predetermined voltage is applied across two ferromagnetic layers of an MTJ element corresponding to a selected bit, and a resistance is read from a current running through this MTJ element. Alternatively, a predetermined current is applied to a selected MTJ element, and a voltage thus generated across two ferromagnetic layers is read.

Therefore, as a reading scheme, a current/voltage detection sensing scheme is used wherein the current or voltage of the selected MTJ element is amplified and detected by a sense amplifier. That is to say, the resistance of the MTJ element is detected in reading, so that a variation in resistance of the MTJ element is the primary cause that determines a read margin in a high-capacity memory.

Furthermore, as a related art of this kind, there has been disclosed a technique for reducing the area occupied on a chip by a reference cell used for data reading (Jpn. Pat. Appln. KOKAI Publication No. 2004-103060).

BRIEF SUMMARY OF THE INVENTION

According to an aspect of the present invention, there is provided a resistance change memory comprising: at least two memory cell arrays each including a plurality of memory cells arranged in a matrix form, the memory cells including variable resistive elements which have two resistance states based on stored data; two reference cell arrays provided to correspond to the two memory cell arrays, respectively, and each including a plurality of reference cells arranged in a row direction, the reference cells having a reference value to judge the resistance state of the memory cells; a reference word line connected to each of the reference cell arrays; a plurality of word lines selecting a row of each of the memory cell arrays; a plurality of bit lines selecting a column of the memory cell arrays and the reference cell arrays; and a sense amplifier shared by the two memory cell arrays and detecting data in an accessed memory cell by use of a reference cell array corresponding to a second memory cell array different from a first memory cell array including the accessed memory cell. In reading the data, a particular reference cell in one reference cell array is always activated for an address space based on one memory cell array as a unit.

According to an aspect of the present invention, there is provided a resistance change memory comprising: at least two memory cell arrays each including a plurality of memory cells arranged in a matrix form, the memory cells including variable resistive elements which have two resistance states based on stored data; two reference cell arrays provided to correspond to the two memory cell arrays, respectively, and each including a plurality of reference cells arranged in a column direction, the reference cells having a reference value to judge the resistance state of the memory cells; a reference bit line connected to each of the reference cell arrays; a plurality of bit lines selecting a column of each of the memory cell arrays; a plurality of word lines selecting a row of the memory cell arrays and the reference cell arrays; and a sense amplifier shared by the two memory cell arrays and detecting data in an accessed memory cell by use of a reference cell array corresponding to a second memory cell array different from a first memory cell array including the accessed memory cell. In reading the data, a particular reference cell in one reference cell array is always activated for an address space based on one memory cell array as a unit.

BRIEF DESCRIPTION OF THE SEVERAL VIEWS OF THE DRAWING

FIG. 6 is a circuit diagram showing the configuration of a reference cell RC;

FIG. 7 is a block diagram showing the configuration of a column decoder 13-1;

FIG. 8 is a circuit diagram showing the configuration of a multiplexer MUX included in column decoder 13-1;

FIG. 9 is a circuit diagram showing the configuration of a fuse latch circuit 15-1;

FIG. 10 is a timing chart showing the operation of the fuse latch circuit 15-1;

DETAILED DESCRIPTION OF THE INVENTION

[Studies to Reach the Present Invention]

One block is constituted of a memory cell array including (m×n) memory cells arranged in a matrix form, and one line of m reference cells provided to correspond to one memory cell array. Further, a sense amplifier shared by two blocks detects and amplifies data in an accessed memory cell by use of a voltage or current read from the accessed memory cell included in a first block and by use of a reference voltage or reference current read from the reference cell included in a second block. In this case, (2×m) reference cells are connected to the common sense amplifier for 2×(m×n) memory cell groups.

It is generally known that the resistance of the memory cell has a particular distribution due to, for example, a variation in manufacture and that this distribution conforms to a normal distribution. Therefore, in order to enable reading from all the memory cells connected to the sense amplifier in such a manner as to allow for a margin, a resistance change value between "0" and "1" and the standard deviation ($\sigma$R) of a variation in resistance of the memory cells are extremely important parameters.

Figure 1:
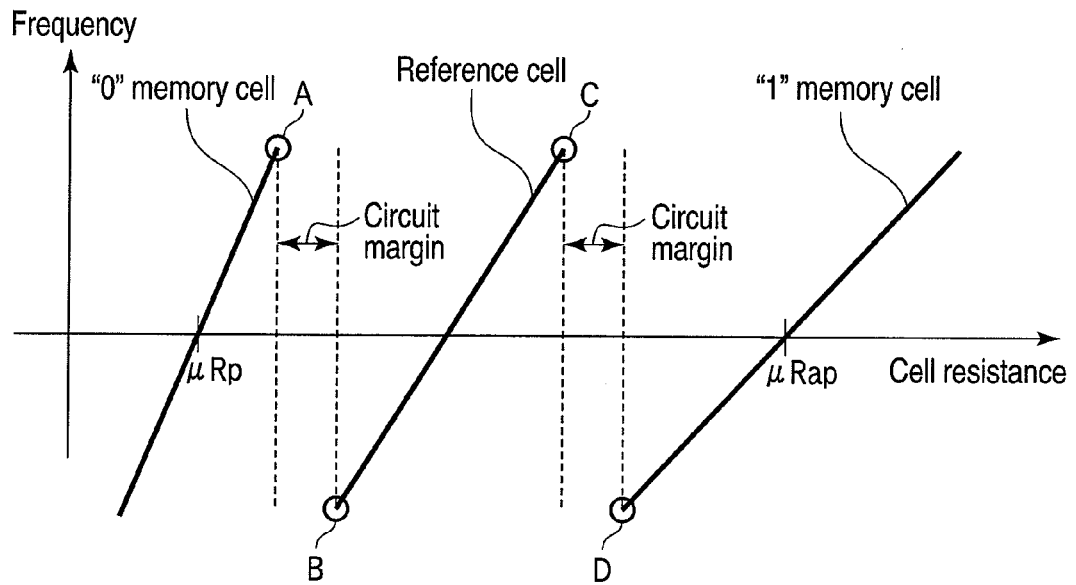
FIG. 1 is a graph showing the relation between the resistance change values and the standard deviations (σR) of variations in resistance of a memory cell and a reference cell.

FIG. 1 is a graph in which the relation between the resistance change values and the standard deviations ($\sigma$R) of variations in resistance of the memory cell and the reference cell is plotted on normal probability paper. A low-resistance state of the memory cell is matched with "0" information. The mean resistance is represented by $\mu$Rp, and its standard deviation is represented by $\sigma$Rp. Here, $\mu$Rap which is the mean resistance in a high-resistance state corresponding to "1" information is "$\mu$Rap=$\mu$Rp×(1+MR)", and its standard deviation $\sigma$Rap is "$\sigma$Rap=$\sigma$Rp×(1+MR)". "MR" indicates the rate of the resistance change of the memory cell, and is represented by "MR=(Rap−Rp)/Rp".

In FIG. 1, a point A is a point where a straight line determined by $\sigma$Rp which represents the variation in resistance of the memory cell storing "0" information ("0" memory cell) is extended to a probability corresponding to the reciprocal number of (2×m×n) which is the total number of memory cells connected to the sense amplifier. A point D is a point where a straight line determined by $\sigma$Rap which represents the variation in resistance of the memory cell storing "1" information ("1" memory cell) is extended to a probability corresponding to the reciprocal number of (2×m×n) which is the total number of memory cells. As shown in FIG. 1, the necessary condition for normally reading data in all the memory cells is that there should be a cumulative probability distribution of the variation in resistance of all of (2×m) reference cells between the point A and the point D.

In other words, it is necessary that there should be finite resistance widths between the point A and a point B and between a point C and the point D. In addition, the extension between the point A and the point B and the extension between the point C and the point D are generally called circuit margins, and are determined, for example, by a variation in the threshold value of pair transistors constituting the sense amplifier, a variation in a power supply voltage or a variation in operation temperature.

As described above, the resistance variation ($\sigma$Rp) and the resistance change rate (MR) are important factors in stably reading information in such a manner as to ensure a sufficient circuit margin, and it is necessary to decrease $\sigma$Rp or increase MR. On the other hand, the total number of reference cells is also important in ensuring a read margin. The expansion of the read margin can be expected in a probabilistic manner by reducing the number of reference cells necessary for a read operation. However, if the number of reference cells is simply reduced, it is impossible to read from all of the memory cells paired with the reference cells and a considerable number of failed bits are produced when the reference cells have become defective, for example, extremely low resistance due to the destruction of barrier film.

Generally, in a semiconductor memory, redundant bits are prepared, and are replaced with the failed bits to improve yield. However, if more failed bits are produced than the installed redundant bits, there is no longer any help, and nondefective chips can not be acquired, such that it is impossible to reduce the prices of memory chips.

Embodiments of the invention based on the above-mentioned studies are described below with reference to the drawings. It should be noted that elements of the same function and configuration are provided with the same sings in the following description and are repeatedly described only when necessary.

[First Embodiment]

Figure 2:
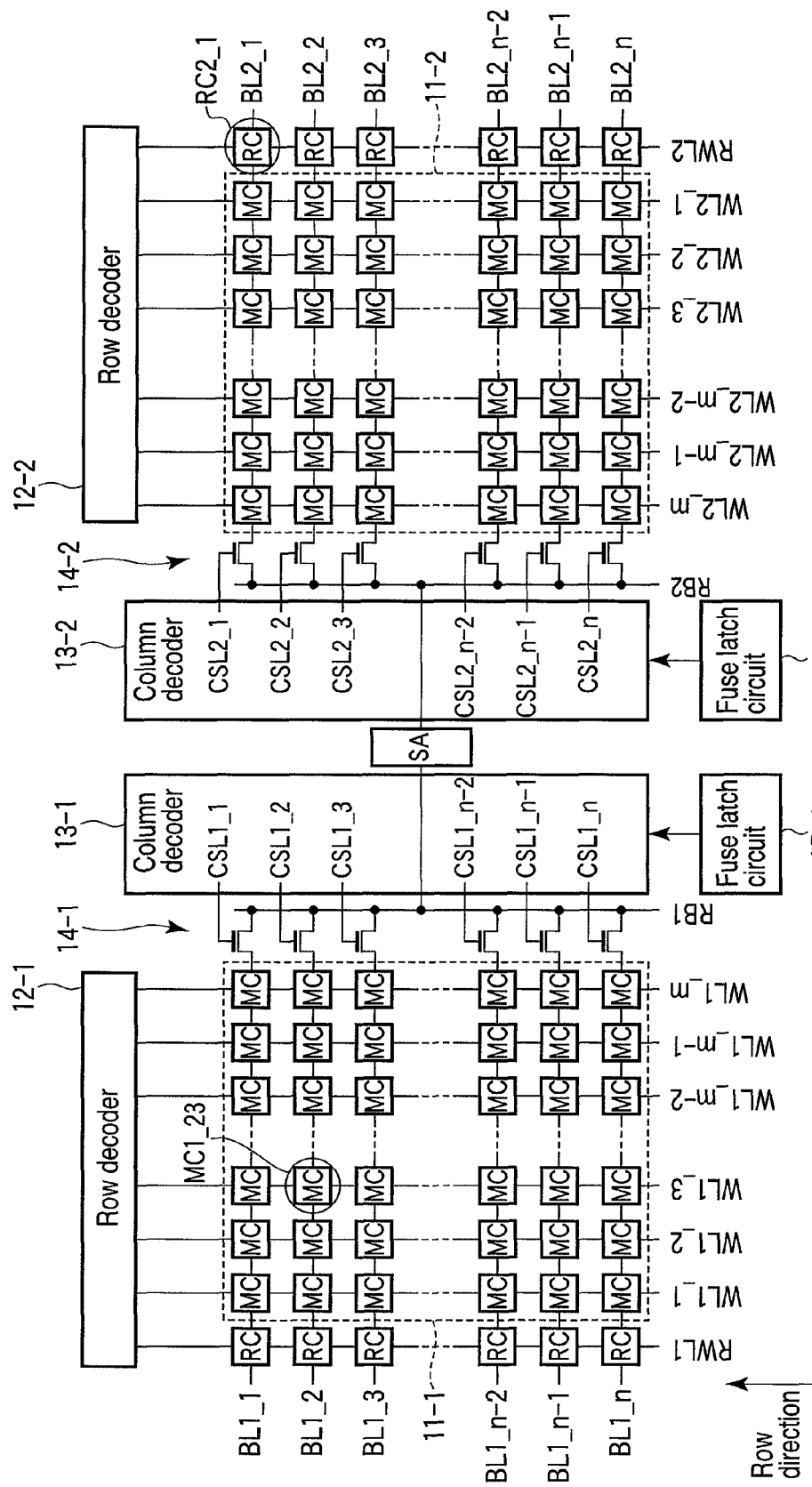
FIG. 2 is a block diagram of a read system circuit of a resistance change memory according to a first embodiment of the present invention.

FIG. 2 is a block diagram of a read system circuit of a resistance change memory according to a first embodiment of the present invention.

The resistance change memory comprises two memory cell arrays 11-1 and 11-2. Each of the memory cell arrays 11 includes (m×n) memory cells MC arranged in a matrix form.

n bit lines BL1_1 to BL1_n are provided in memory cell array 11-1 so that each of the bit lines extends in the column direction. Further, m word lines WL1_1 to WL1_m are provided in memory cell array 11-1 so that each of the word lines extends in the row direction. The memory cells MC are disposed at intersection regions of bit lines BL1 and word lines WL1, and each of the memory cells MC is connected to bit line BL1 and word line WL1 that correspond to it.

n reference cells RC provided to correspond to memory cell array 11-1 are adjacently arranged in the column direction of memory cell array 11-1. The n reference cells RC are connected to one reference word line RWL1 extending in the row direction, and are arranged in the row direction. Moreover, the n reference cells RC are connected to n bit lines BL1_1 to BL1_n, respectively. In addition, the number of the reference cells RC does not have to be the same as the number n of columns, and may be smaller than the number n of columns.

Similarly, n bit lines BL2_1 to BL2_n are provided in memory cell array 11-2 so that each of the bit lines extends in the column direction. Further, m word lines WL2_1 to WL2_m are provided in memory cell array 11-2 so that each of the word lines extends in the row direction. The memory cells MC are disposed at intersection regions of bit lines BL2 and word lines WL2, and each of the memory cells MC is connected to bit line BL2 and word line WL2 that correspond to it.

n reference cells RC provided to correspond to memory cell array 11-2 are adjacently arranged in the column direction of memory cell array 11-2. The n reference cells RC are connected to one reference word line RWL2 extending in the row direction, and are arranged in the row direction. Moreover, the n reference cells RC are connected to n bit lines BL2_1 to BL2_n, respectively. In addition, the number of the reference cells RC on the side of memory cell array 11-2 does not have to be the same as the number n of columns either, and may be smaller than the number n of columns.

Various memories can be used as the resistance change memory to achieve the present embodiment, such as a magnetic random access memory (MRAM), a resistive random access memory (ReRAM) and a phase-change random access memory (PRAM). In the present embodiment, the MRAM is explained by way of example.

Figure 3:
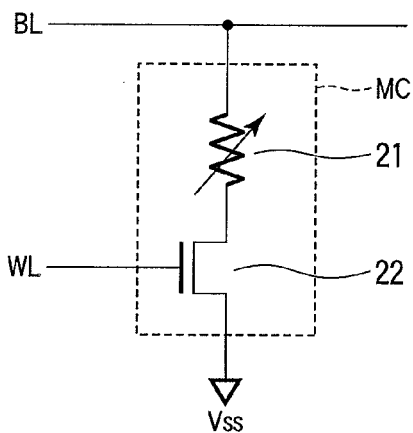
FIG. 3 is a circuit diagram showing the configuration of a memory cell MC.

FIG. 3 is a circuit diagram showing the configuration of the memory cell MC. The memory cell MC has a variable resistive element (MTJ element) 21 and a selective transistor 22. The selective transistor 22 is composed of, for example, an N-channel MOS transistor. One end of the MTJ element 21 is connected to the bit line BL, and the other end is connected to the drain of the selective transistor 22. The gate of the selective transistor 22 is connected to the word line WL. The source of the selective transistor 22 is grounded, for example, via a source line (to which a ground potential Vss is applied).

Figure 4:
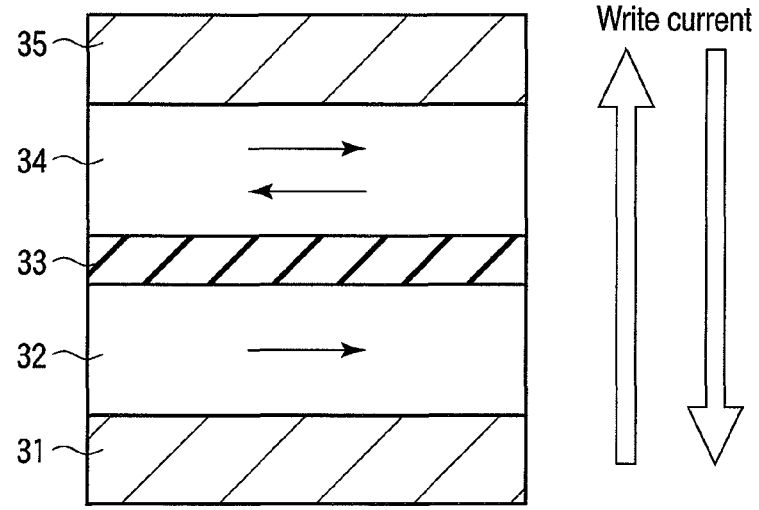
FIG. 4 is a schematic diagram showing the configuration of an MTJ element 21.

FIG. 4 is a schematic diagram showing the configuration of the MTJ element 21. The MTJ element 21 has a lower electrode 31, a fixed layer (pinned layer) 32, an intermediate layer (nonmagnetic layer) 33, a recording layer (free layer) 34 and an upper electrode 35 that are stacked in order. In addition, the layers constituting the MTJ element 21 may be stacked in reverse order.

The fixed layer 32 is made of a ferromagnetic material, and has a fixed magnetization direction. For example, an antiferromagnetic layer (not shown) can be provided adjacently to the fixed layer 32 to fix the magnetization direction of the fixed layer 32. The free layer 34 is made of a ferromagnetic material, and has a variable magnetization direction. The intermediate layer 33 is made of a nonmagnetic material. Specifically, a nonmagnetic metal, a nonmagnetic semiconductor or an insulating material can be used for the intermediate layer 33.

The easy magnetization direction of the fixed layer 32 and the free layer 34 may be perpendicular to a film surface (perpendicular magnetization) or may be parallel to a film surface (in-plane magnetization). In contrast to the in-plane magnetization, the perpendicular magnetization does not require the control of an element shape to determine the magnetization direction, and is advantageously suited to miniaturization.

In addition, each of the fixed layer 32 and the free layer 34 is not limited to a shown single layer, and may have a stacked structure composed of a plurality of ferromagnetic layers. Moreover, each of the fixed layer 32 and the free layer 34 may be composed of three layers including a first ferromagnetic layer, a nonmagnetic layer and a second ferromagnetic layer, and may have an antiferromagnetically coupled structure in which the first and second ferromagnetic layers are magnetically coupled together (interlayer exchange coupling) so that the magnetization directions of these layers may be antiparallel, or may have a ferromagnetically coupled structure in which the first and second ferromagnetic layers are magnetically coupled together (interlayer exchange coupling) so that the magnetization directions of these layers may be parallel.

Furthermore, the MTJ element 21 may have a double junction structure. The MTJ element 21 of the double junction structure has a stacked structure including a first fixed layer, a first intermediate layer, a free layer, a second intermediate layer and a second fixed layer that are stacked in order. The advantage of such a double junction structure is that the magnetization inversion of the free layer 34 by spin injection is easily controlled.

Figure 5A:
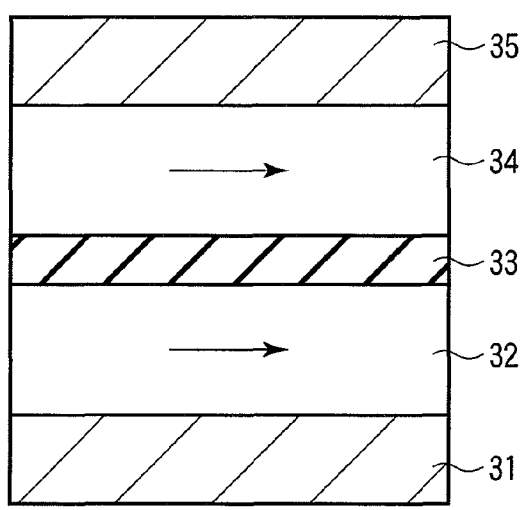
FIGS. 5A and 5B are diagrams showing a low-resistance state and a high-resistance state of the MTJ element 21.
Figure 5B:
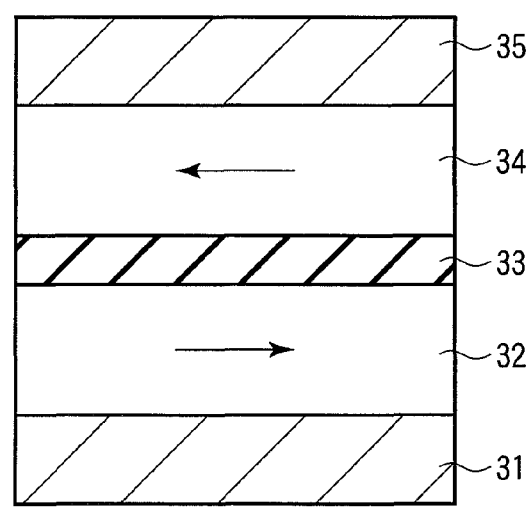

FIGS. 5A and 5B are diagrams showing a low-resistance state and a high-resistance state of the MTJ element 21. The low-resistance state and the high-resistance state of the MTJ element 21 in accordance with a spin injection writing method is described below. It is to be noted that a current means the flow of electrons in this description.

First, a parallel state (low-resistance state) in which the magnetization directions of the fixed layer 32 and the free layer 34 are parallel is described. In this case, a current running from the fixed layer 32 to the free layer 34 is supplied. The majority of electrons which have passed through the fixed layer 32 have spins parallel to the magnetization direction of the fixed layer 32. The spin angular momentum of the majority of electrons transfers to the free layer 34, so that spin torque is applied to the free layer 34, and the magnetization direction of the free layer 34 is aligned with the magnetization direction of the fixed layer 32. The resistance of the MTJ element 21 in the case of this parallel arrangement is lowest. This case is defined as "0" data.

Next, an antiparallel state (high-resistance state) in which the magnetization directions of the fixed layer 32 and the free layer 34 are antiparallel is described. In this case, a current running from the free layer 34 to the fixed layer 32 is supplied. The majority of electrons which have reflected by the fixed layer 32 have spins antiparallel to the magnetization direction of the fixed layer 32. The spin angular momentum of the majority of electrons transfers to the free layer 34, so that spin torque is applied to the free layer 34, and the magnetization direction of the free layer 34 is aligned in antiparallel with the magnetization direction of the fixed layer 32. The resistance of the MTJ element 21 in the case of this antiparallel arrangement is highest. This case is defined as "1" data.

FIG. 6 is a circuit diagram showing the configuration of the reference cell RC. The reference cell RC has a fixed resistive element 23 and a selective transistor 24. The selective transistor 24 is composed of, for example, an N-channel MOS transistor. One end of the fixed resistive element 23 is connected to the bit line BL, and the other end is connected to the drain of the selective transistor 24. The gate of the selective transistor 24 is connected to the reference word line RWL. The source of the selective transistor 24 is grounded, for example, via a source line (to which the ground potential Vss is applied).

The fixed resistive element 23 is fixed at a middle resistance (reference) between the low-resistance state and the high-resistance state of the memory cell MC. The fixed resistive element 23 is formed in a process similar to that of the MTJ element 21, and basically has a stacked structure similar to that of the MTJ element 21. This allows the fixed resistive element 23 and the MTJ element 21 to have the same temperature characteristics and a variation in manufacture. In order to fix the resistance of the fixed resistive element 23 at a predetermined reference value, the areas of the two ferromagnetic layers can be changed in such a manner as to remain the magnetization directions of these ferromagnetic layers fixed.

As shown in FIG. 2, a row decoder 12-1 is connected to word line WL1 and reference word line RWL1. A row decoder 12-2 is connected to word line WL2 and reference word line RWL2. The row decoder 12-1 selects one line out of word lines WL1 and reference word line RWL1 in accordance with an address. The row decoder 12-2 selects one line out of word lines WL2 and reference word line RWL2 in accordance with an address.

Specifically, the row decoder 12-1 selects one of word lines WL1 when an accessed memory cell is included in memory cell array 11-1 to which this row decoder is connected. Alternatively, the row decoder 12-1 selects reference word line RWL1 when an accessed memory cell is not included in memory cell array 11-1 to which this row decoder is connected. In the same manner, the row decoder 12-2 selects one of word lines WL2 when an accessed memory cell is included in memory cell array 11-2 to which this row decoder is connected. Alternatively, the row decoder 12-2 selects reference word line RWL2 when an accessed memory cell is not included in memory cell array 11-2 to which this row decoder is connected.

n bit lines BL1 are connected to a read data line RB1 via a column select circuit 14-1. Column select circuit 14-1 has the number of column select transistors corresponding to the n bit lines BL1. The column select transistor is composed of, for example, an N-channel MOS transistor. The gates of n column select transistors included in column select circuit 14-1 are connected to a column decoder 13-1 via column select lines CSL1_1 to CSL1_n, respectively.

Similarly, n bit lines BL2 are connected to a read data line RB2 via a column select circuit 14-2. Column select circuit 14-2 has the number of column select transistors corresponding to the n bit lines BL2. The gates of n column select transistors included in column select circuit 14-2 are connected to a column decoder 13-2 via column select lines CSL2_1 to CSL2_n, respectively.

A sense amplifier SA shared by memory cell arrays 11-1 and 11-2 is connected to the read data lines RB1 and RB2. The sense amplifier SA detects and amplifies data in an accessed memory cell by use of a voltage or current read into one of the read data lines RB1 and RB2 from the accessed memory cell and by use of a voltage or current read into the other of the read data lines RB1 and RB2 from the reference cell.

Column decoder 13-1 selects one of bit lines BL1 in accordance with an address. The selection and control of bit lines BL1 are carried out by selecting (activating) one of column select lines CSL1. Similarly, column decoder 13-2 selects one of bit lines BL2 in accordance with an address. The selection and control of bit lines BL2 are carried out by selecting (activating) one of column select lines CSL2. Specific operation of the column decoder 13 will be described later.

(Operation)

Next, the operation of the resistance change memory having such a configuration is described. For example, suppose that, in FIG. 2, an encircled memory cell MC1_23 located at the intersection of word line WL1_3 and bit lines BL1_2 in the left memory cell array 11-1 is selected.

In this case, word line WL1_3 is selected (activated) by the row decoder 12-1, and memory cell MC1_23 and bit line BL1_2 are connected to each other. Further, column select line CSL1_2 is activated by column decoder 13-1, and memory cell MC1_23 is connected to the sense amplifier SA via read data line RB1.

On the other hand, the reference cell RC is selected from the right block. That is, reference word line RWL2 is activated by the row decoder 12-2 together with the activation of word line WL1_3.

Here, column decoder 13-2 controls so that column select line CSL2_1 is always activated regardless of the address of the accessed bit. A reference cell RC2_1 is connected to the sense amplifier SA via read data line RB2. The sense amplifier SA detects and amplifies data in memory cell MC1_23 by use of a voltage or current read into read data line RB2 from memory cell MC1_23 and by use of a voltage or current read into read data line RB2 from reference cell RC2_1.

Thus, reference cell RC2_1 is used to read from all the memory cells arranged in the left block, so that the number of reference cells can be reduced. Similarly, when a memory cell in the right block is selected, column decoder 13-1 controls so that, for example, column select line CSL1_1 is always activated regardless of the address of the accessed bit. As a result, a reference cell RC1_1 is used to read from all the memory cells arranged in the right block, so that the number of reference cells can be reduced.

Such control enables the read operation to be consistently carried out whether the right or left memory cell array is selected. In the present embodiment, the total number of reference cells RC necessary for reading is two, so that the total number of reference cells can be much smaller than heretofore. Therefore, it is only necessary to ensure a small margin for the variations in resistance of the reference cells, thus making it easier to ensure a read margin.

Next, control operation to enable the selection of the reference cell RC is described. In the present embodiment, the reference cell which is always selected can be changed regardless of the address of the accessed bit. Thus, when, for example, reference cell RC2_1 is defective, column select line CSL2_2 is always activated instead of column select line CSL2_1, such that a reference cell connected to bit line BL2_2 can be selected. Therefore, if reference cell is a normal cell, the generation of a defective product can be avoided. In addition, even when a so-called preliminary reference cell can be selected as in the present scheme, the total number of reference cells installed in a chip can be set to be equal to or less than heretofore. Thus, there is no increase in the size of a chip when the present embodiment is carried out.

FIG. 7 is a block diagram showing the configuration of column decoder 13-1. Two kinds of addresses are supplied to a multiplexer MUX. The two kinds of addresses include an externally input address AIN corresponding to an access bit address, and an address FLTC from a fuse latch circuit 15-1. Address FLTC for selecting a particular reference cell is programmed in the fuse latch circuit 15-1.

The switch between the two kinds of addresses is controlled by a block activation signal BACT_1 and BACT_2. Block activation signal BACT_1 is activated when a memory cell included in memory cell array 11-1 is accessed, while block activation signal BACT_2 is activated when a memory cell included in memory cell array 11-2 is accessed.

Specifically, if block activation signal BACT_1 is activated, the multiplexer MUX included in column decoder 13-1 selects address AIN, and outputs this address AIN as an address AD and outputs an inverted signal of address AIN as an address bAD. Addresses bAD and AD are supplied to a decoding unit 13A. On the other hand, if block activation signal BACT_2 is activated, the multiplexer MUX included in column decoder 13-1 selects address FLTC, and outputs this address FLTC as an address AD and outputs an inverted signal of address FLTC as an address bAD.

The decoding unit 13A activates one of column select lines CSL1_1 to CSL1_n in accordance with addresses bAD and AD. It should be noted that the configuration of column decoder 13-2 provided to correspond to memory cell array 11-2 is similar to column decoder 13-1 described above. Owing to such operation of the column decoder 13, a particular reference cell is always selected in the block which does not include the accessed memory cell.

Next, one example of the configuration of the multiplexer MUX is described. FIG. 8 is a circuit diagram showing the configuration of the multiplexer MUX. In addition, FIG. 8 shows the multiplexer MUX included in column decoder 13-1.

An address AINi and block activation signal BACT_1 are input to first and second input terminals of an AND gate 41, respectively. "i" indicates any one of n bits corresponding to the number of column select lines CSL1. An output of the AND gate 41 is input to a first input terminal of a NOR gate 43.

An address FLTCi and block activation signal BACT_2 are input to first and second input terminals of an AND gate 42, respectively. An output of the AND gate 42 is input to a second input terminal of the NOR gate 43.

The NOR gate 43 outputs an address bADi. An output of the NOR gate 43 is input to an input terminal of an inverter 44. The inverter 44 outputs an address ADi. In addition, the block activation signals BACT_1 and BACT_2 in FIG. 8 can be interchanged for the multiplexer MUX included in column decoder 13-2.

Next, one example of the configuration of the fuse latch circuit 15-1 is described. FIG. 9 is a circuit diagram showing the configuration of the fuse latch circuit 15-1. The configuration of a fuse latch circuit 15-2 is the same as the configuration of the fuse latch circuit 15-1 in FIG. 9.

A power-on signal PWRON is externally supplied to the fuse latch circuit 15-1. The power-on signal PWRON is made high during power-on and low during power-off.

A power supply voltage Vdd is applied to the source of a P-channel MOS transistor 51. The power-on signal PWRON is input to the gate of the P-channel MOS transistor 51. The drain of the P-channel MOS transistor 51 is connected to the drain of an N-channel MOS transistor 52.

The power-on signal PWRON is input to the gate of the N-channel MOS transistor 52. The source of the N-channel MOS transistor 52 is connected to one end of a fuse element 53. The other end of the fuse element 53 is grounded. The fuse element 53 stores data "0" or "1" depending on whether the fuse element 53 has been blown by laser.

The drain of the P-channel MOS transistor 51 is connected to an input terminal of a latch circuit 54. The latch circuit 54 is composed of two inverters. The output of one inverter is connected to the input of the other, and the input of the one inverter is connected to the output of the other.

The output terminal of the latch circuit 54 is connected to the input terminal of an inverter 55. The inverter 55 outputs address FLTCi.

FIG. 10 is a timing chart showing the operation of the fuse latch circuit 15-1. When the power (Vdd) is applied and the voltage in the chip rises to a logic circuit operable voltage, address bits FLTC which are the output of the fuse latch circuit 15-1 once go high. After the power application, the FLTC goes low for an address bit having the unblown fuse element 53 synchronously with the rising of the power-on signal PWRON which is an internal signal indicating the completion of initialization within the chip. On the other hand, if the fuse element 53 is blown, an address bit of the FLTC stays high.

The fuse element corresponding to the least significant address alone is blown to program address FLTC at (100 . . . 0), and this is allocated to column select line CSL1_1 such that column select line CSL1_1 can always be selected. Moreover, the fuse element corresponding to the second least significant address alone is blown to program address FLTC at (010 . . . 0), and this is allocated to column select line CSL1_2 such that column select line CSL1_2 can always be selected. The introduction of the allocation of the column select line to the circuit described above enables any reference cell to be selected by the programming of the fuse element.

As described above, in the present embodiment, when, for example, a memory cell disposed in the block on the left of the sense amplifier SA is selected, a particular reference cell disposed in the block on the right of the sense amplifier SA is always selected as a reference cell. In addition, any one of the plurality of reference cells is selected by the row decoder 12 as the always selected reference cell.

Thus, according to the present embodiment, the particular reference cell is used to read from all of the memory cells arranged in one memory cell array, so that the total number of reference cells can be reduced. Therefore, it is only necessary to ensure a small margin for the variations in resistance of the reference cells, thus making it easier to ensure a read margin.

Furthermore, in the present embodiment, the reference cell which is always selected can be changed regardless of the address of the accessed bit. Therefore, when a reference cell is defective, this reference cell is replaced with another reference cell as an always selected reference cell, such that the generation of a defective product can be avoided. Consequently, a high-capacity resistance change memory can be obtained at low cost with no decrease in yield.

[Second Embodiment]

In a second embodiment, a plurality of reference cells are arranged in the column direction, and these reference cells are connected to a reference bit line. Then, particular one of the plurality of reference cells arranged in the column direction is always selected.

Figure 11:
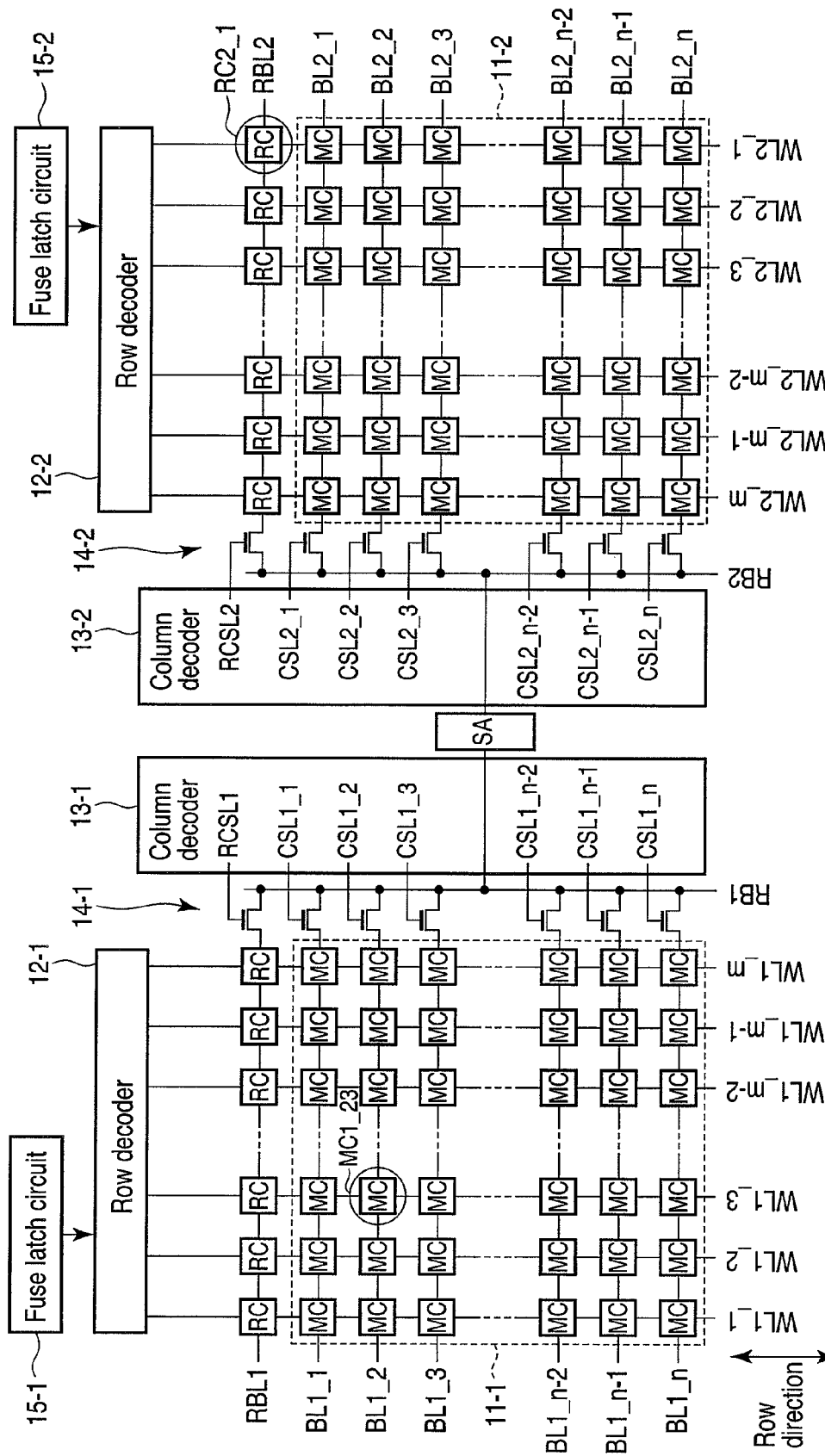
FIG. 11 is a block diagram of a read system circuit of a resistance change memory according to a second embodiment of the present invention.

FIG. 11 is a block diagram of a read system circuit of a resistance change memory according to the second embodiment of the present invention.

m reference cells RC provided to correspond to a memory cell array 11-1 are adjacently arranged in the row direction of memory cell array 11-1. The m reference cells RC are connected to one reference bit line RBL1 extending in the column direction, and are arranged in the column direction. Moreover, the m reference cells RC are connected to m word lines WL1_1 to WL1_m, respectively. In addition, the number of the reference cells RC does not have to be the same as the number m of rows, and may be smaller than the number m of rows.

Similarly, m reference cells RC provided to correspond to a memory cell array 11-2 are adjacently arranged in the row direction of memory cell array 11-2. The m reference cells are connected to one reference bit line RBL2 extending in the column direction, and are arranged in the column direction. Moreover, the m reference cells RC are connected to m word lines WL2_1 to WL2_m, respectively. In addition, the number of the reference cells RC on the side of memory cell array 11-2 does not have to be the same as the number m of rows either, and may be smaller than the number m of rows.

Reference bit line RBL1 is connected to read data line RB1 via a column select circuit 14-1. The gate of a column select transistor included in column select circuit 14-1 and connected to reference bit line RBL1 is connected to a column decoder 13-1 via a reference column select line RCSL1. Reference bit line RBL2 is connected to a read data line RB2 via a column select circuit 14-2. The gate of a column select transistor included in column select circuit 14-2 and connected to reference bit line RBL2 is connected to a column decoder 13-2 via a reference column select line RCSL2.

Column decoder 13-1 selects one line out of column select lines CSL1 and reference column select line RCSL1 in accordance with an address. Column decoder 13-2 selects one line out of column select lines CSL2 and reference column select line RCSL2 in accordance with an address.

Specifically, column decoder 13-1 selects one of column select lines CSL1 when an accessed memory cell is included in memory cell array 11-1 to which this column decoder is connected. Alternatively, column decoder 13-1 selects reference column select line RCSL1 when an accessed memory cell is not included in memory cell array 11-1 to which this column decoder is connected. In the same manner, column decoder 13-2 selects one of column select lines CSL2 when an accessed memory cell is included in memory cell array 11-2 to which this column decoder is connected. Alternatively, column decoder 13-2 selects reference column select line RCSL2 when an accessed memory cell is not included in memory cell array 11-2 to which this column decoder is connected.

m word lines WL1 are connected to a row decoder 12-1. The row decoder 12-1 selects one of word lines WL1 in accordance with an address. m word lines WL2 are connected to a row decoder 12-2. The row decoder 12-2 selects one of word lines WL2 in accordance with an address. Specific operation of the row decoder 12 will be described later.

Next, the operation of the resistance change memory having such a configuration is described. For example, suppose that an encircled memory cell MC1_23 located at the intersection of word line WL1_3 and bit lines BL1_2 in the left memory cell array 11-1 is selected.

In this case, word line WL1_3 is selected (activated) by the row decoder 12-1, and memory cell MC1_23 and bit line BL1_2 are connected to each other. Further, column select line CSL1_2 is activated by column decoder 13-1, and memory cell MC1_23 is connected to a sense amplifier SA via read data line RB1.

On the other hand, a reference cell RC is selected from the right block. That is, reference column select line RCSL2 is activated by column decoder 13-2 together with the activation of column select line CSL1_2, and reference bit line RBL2 is connected to read data line RB2.

Here, the row decoder 12-2 controls so that word line WL2_1 is always activated regardless of the address of the accessed bit. A reference cell RC2_1 is connected to the sense amplifier SA via read data line RB2. The sense amplifier SA detects and amplifies data in memory cell MC1_23 by use of a voltage or current read into read data line RB2 from memory cell MC1_23 and by use of a voltage or current read into read data line RB2 from reference cell RC2_1.

Thus, reference cell RC2_1 is used to read from all the memory cells arranged in the left block, so that the number of reference cells can be reduced. Similarly, when a memory cell in the right block is selected, the row decoder 12-1 controls so that, for example, word line WL1_1 is always activated regardless of the address of the accessed bit. As a result, a reference cell RC1_1 is used to read from all the memory cells arranged in the right block, so that the number of reference cells can be reduced.

Such control enables the read operation to be consistently carried out whether the right or left memory cell array is selected. In the present embodiment, the total number of reference cells RC necessary for reading is two, so that the total number of reference cells RC can be much smaller than heretofore. Therefore, it is only necessary to ensure a small margin for the variations in resistance of the reference cells, thus making it easier to ensure a read margin.

Next, control operation to enable the selection of the reference cell RC is described. In the present embodiment, the reference cell which is always selected can be changed regardless of the address of the accessed bit. Thus, when, for example, reference cell RC2_1 is defective, word line WL2_2 is always activated instead of word line WL2_1, such that a reference cell connected to word line WL2_2 and reference bit line RBL2 can be selected. Therefore, if reference cell is a normal cell, the generation of a defective product can be avoided.

Figure 12:
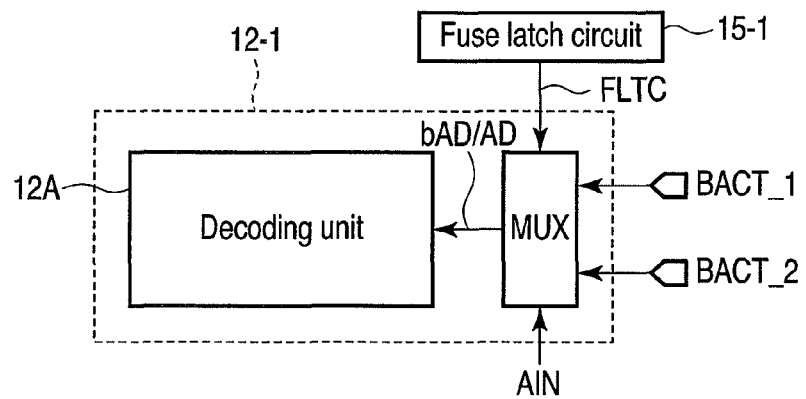
FIG. 12 is a block diagram showing the configuration of a row decoder 12-1.

FIG. 12 is a block diagram showing the configuration of the row decoder 12-1. Two kinds of addresses are supplied to a multiplexer MUX. The two kinds of addresses include an externally input address AIN corresponding to an access bit address, and an address FLTC from a fuse latch circuit 15-1. Address FLTC for selecting a particular reference cell is programmed in the fuse latch circuit 15-1. The configuration of the fuse latch circuit 15-1 is the same as the configuration shown in the first embodiment in FIG. 9.

The switch between the two kinds of addresses is controlled by block activation signals BACT_1 and BACT_2. Block activation signal BACT_1 is activated when a memory cell included in memory cell array 11-1 is accessed, while block activation signal BACT_2 is activated when a memory cell included in memory cell array 11-2 is accessed. The configuration of the multiplexer MUX is the same as the configuration shown in the first embodiment in FIG. 8.

A decoding unit 12A receives addresses bAD and AD from the multiplexer MUX. The decoding unit 12A activates one of word lines WL1_1 to WL1_m in accordance with addresses bAD and AD. It should be noted that the configuration of the row decoder 12-2 provided to correspond to memory cell array 11-2 is similar to the row decoder 12-1 described above. Owing to such operation of the row decoder 12, a particular reference cell is always selected in the block which does not include the accessed memory cell. Moreover, the address to be programmed into the fuse latch circuit 15 can be changed to change the reference cell used for reading.

As described above, in the present embodiment, a plurality of reference cells connected to the reference bit line RBL and arranged in the column direction are used as the reference cells necessary for the read operation of the sense amplifier SA. Then, control is performed so that particular one of these reference cells is always selected. As a result, the total number of reference cells can be reduced, and it is easier to ensure a read margin.

Although the MRAM comprising two memory cell arrays is illustrated in FIG. 2 and FIG. 11 used to describe the first and second embodiments, it should be understood that the present invention is not limited thereto. For example, two or more configurations shown in FIG. 2 may be arranged in the row or column direction to construct an MRAM including four or more memory cell arrays. The same holds true with FIG. 11 in the second embodiment.

EXAMPLE

As described above, various memories other than the MRAM can be used as the resistance change memories in the embodiments. An ReRAM and a PRAM are described below as alternative examples of the resistance change memories.

(ReRAM)

Figure 13:
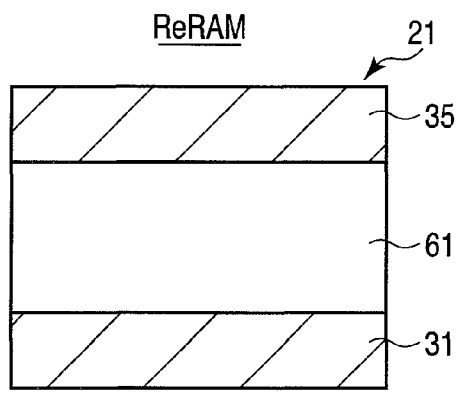
FIG. 13 is a schematic diagram showing the configuration of a variable resistive element 21 used in an ReRAM.

FIG. 13 is a schematic diagram showing the configuration of a variable resistive element 21 used in the ReRAM. The variable resistive element 21 has a lower electrode 31, an upper electrode 35, and a recording layer 61 interposed between these electrodes.

The recording layer 61 is made of a transition metal oxide such as a perovskite-like metal oxide or a binary metal oxide. The perovskite-like metal oxide includes, for example, PCMO ($Pr_{0.7}Ca_{0.3}MnO_3$), Nb-added $SrTi(Zr)O_3$ and Cr-added $SrTi(Zr)O_3$. The binary metal oxide includes, for example, $NiO$, $TiO_2$ and $Cu_2O$.

The variable resistive element 21 changes its resistance because of a change in the polarity of a voltage applied to this variable resistive element (bipolar type), or changes its resistance because of a change in the absolute voltage applied to this variable resistive element (unipolar type). Thus, the variable resistive element 21 is set to a low-resistance state or a high-resistance state by controlling the applied voltage. In addition, whether the variable resistive element 21 is the bipolar type or the unipolar type depends on the material of the recording layer 61 to be selected.

For example, in the case of the bipolar type variable resistive element 21, a voltage for shifting the variable resistive element 21 from the high-resistance state (reset state) to the low-resistance state (set state) is a set voltage Vset, while a voltage for shifting the variable resistive element 21 from the low-resistance state (set state) to the high-resistance state (reset state) is a reset voltage Vreset. Then, the set voltage Vset is set to a positive bias for applying a positive voltage to the upper electrode 35 on the basis of the lower electrode 31, while the reset voltage Vreset is set to a negative bias for applying a negative voltage to the upper electrode 35 on the basis of the lower electrode 31. Further, the low-resistance state and the high-resistance state are matched with "0" data and "1" data, respectively, such that the variable resistive element 21 can store one-bit data.

For reading data, a sufficiently low read voltage which is about $1/1000$ to $1/4$ of the reset voltage Vreset is applied to the variable resistive element 21. Then, a current running through the variable resistive element 21 at the moment is detected such that data can be read.

(PRAM)

Figure 14:
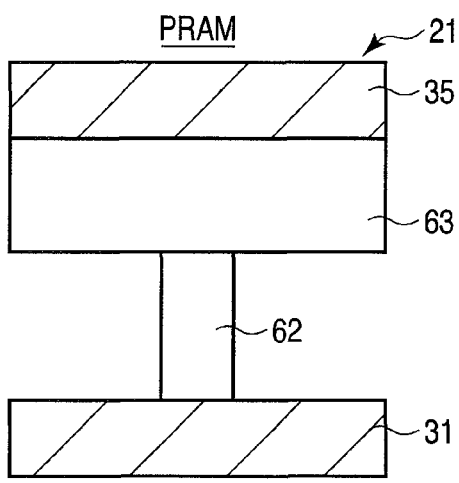
FIG. 14 is a schematic diagram showing the configuration of the variable resistive element 21 used in a PRAM.

FIG. 14 is a schematic diagram showing the configuration of the variable resistive element 21 used in the PRAM. The variable resistive element 21 has a lower electrode 31, a heater layer 62, a recording layer 63 and an upper electrode 35 that are stacked in order.

The recording layer 63 is made of a phase-change material, and is set into a crystalline state and amorphous state by heat generated during writing. The material of the recording layer 63 includes chalcogen compounds such as Ge—Sb—Te, In—Sb—Te, Ag—In—Sb—Te and Ge—Sn—Te. These materials are preferable in ensuring high-speed switching characteristics, repeated recording stability and high reliability.

The heater layer 62 is in contact with the bottom surface of the recording layer 63. The area of contact of the heater layer 62 with the recording layer 63 is preferably smaller than the area of the bottom surface of the recording layer 63. The purpose is to decrease a write current or voltage by reducing the part of contact between the heater layer 62 and the recording layer 63 to reduce a heated part. The heater layer 62 is made of a conducting material, and is preferably made of, for example, a material selected from the group consisting of TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W and Cu. Moreover, the heater layer 62 may be made of the same material as the lower electrode 31 described later.

The area of the lower electrode 31 is greater than the area of the heater layer 62. The upper electrode 35 has, for example, the same planar shape as the recording layer 63. The material of the lower electrode 31 and the upper electrode 35 includes a high melting point metal such as Ta, Mo or W.

The heating temperature of the recording layer 63 changes by controlling the intensity of a current pulse applied thereto or the width of the current pulse, such that the recording layer 63 changes into the crystalline state or amorphous state. Specifically, in writing, a voltage or current is applied across the lower electrode 31 and the upper electrode 35, and a current is passed to the lower electrode 31 from the upper electrode 35 via the recording layer 63 and the heater layer 62. If the recording layer 63 is heated to near the melting point, the recording layer 63 changes into an amorphous phase (high-resistive phase), and remains in the amorphous state even when the application of the voltage or current is stopped.

On the other hand, a voltage or current is applied across the lower electrode 31 and the upper electrode 35. If the recording layer 63 is heated to near a temperature suitable for crystallization, the recording layer 63 changes into a crystalline phase (low-resistive phase), and remains in the crystalline state even when the application of the voltage or current is stopped. When the recording layer 63 is changed into the crystalline state, the intensity of the current pulse applied to the recording layer 63 should be lower and the width of the current pulse should be greater than when the recording layer 63 is changed into the amorphous state. Thus, a voltage or current is applied across the lower electrode 31 and the upper electrode 35 to heat the recording layer 63, such that the resistance of the recording layer 63 can be changed.

Whether the recording layer 63 is in the crystalline phase or the amorphous phase can be known by applying, across the lower electrode 31 and the upper electrode 35, such a low voltage or low current that does not cause the recording layer 63 to be crystalline or amorphous and reading the voltage or current across the lower electrode 31 and the upper electrode 35. Thus, the low-resistance state and the high-resistance state are matched with "0" data and "1" data, respectively, such that one-bit data can be read from the variable resistive element 21.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
    a first cell array comprising a first memory cell array and a first reference cell array, the first memory cell array comprising a plurality of memory cells arranged in a row direction and a column direction, the first reference cell array comprising a plurality of reference cells arranged in the row direction, each of the memory cells comprising a variable resistive element which has two resistance states based on stored data, each of the reference cells comprising a reference value in order to determine a resistance state of the memory cell,
    a second cell array comprising a second memory cell array and a second reference cell array, the second memory cell array comprising a plurality of memory cells arranged in the row direction and the column direction, the second reference cell array comprising a plurality of reference cells arranged in the row direction,
    a first reference word line connected to each of the first reference cell array and a second reference word line connected to each of the second reference cell array;
    a plurality of word lines connected to rows of each of the first and second memory cell arrays;
    a plurality of bit lines connected to columns of each of the first and second cell arrays; and
    a sense amplifier shared by the first and second cell arrays and configured to detect data in an accessed memory cell by use of a reference cell,
    wherein a predetermined reference cell in the second reference cell array is used to read all the memory cells arranged in the first memory cell array.

2. The memory of claim 1, further comprising:
    a column decoder configured to select a bit line for the second cell array, configured to connect to the predetermined reference cell.

3. The memory of claim 2, further comprising:

a latch configured to store an address of the predetermined reference cell and to send the address to the column decoder.

4. The memory of claim 3, wherein
the latch comprises a fuse and configured to store the address in a nonvolatile manner depending on whether the fuse is blown.

5. The memory of claim 3, wherein
the latch configured to switch from the predetermined reference cell to a reference cell comprising a reference value within a predetermined range.

6. The memory of claim 2, wherein
the column decoder is configured to select one of the bit lines for the first cell array in accordance with an address.

7. The memory of claim 2, wherein
the column decoder comprises a selection circuit configured to select either an address of the accessed memory cell or an address of the predetermined reference cell.

8. The memory of claim 1, wherein
the variable resistive elements are magnetoresistive elements.

9. The memory of claim 8, wherein
the magnetoresistive elements each comprises a fixed layer comprising a fixed magnetization direction, a recording layer comprising a variable magnetization direction, and a nonmagnetic layer between the fixed layer and the recording layer.

10. The memory of claim 1, wherein
layer structures of the reference cells is substantially the same as layer structures of the variable resistive elements.

11. The memory of claim 1, wherein
a predetermined reference cell in the first reference cell array is used to read all the memory cells arranged in the second memory cell array.

12. A resistance change memory comprising:
a first cell array comprising a first memory cell array and a first reference cell array, the first memory cell array comprising a plurality of memory cells arranged in a row direction and a column direction, the first reference cell array comprising a plurality of reference cells arranged in the column direction, each of the memory cells comprising a variable resistive element which has two resistance states based on stored data, each of the reference cells comprising a reference value in order to determine a resistance state of the memory cell,
a second cell array comprising a second memory cell array and a second reference cell array, the second memory cell array comprising a plurality of memory cells arranged in the row direction and the column direction, the second reference cell array comprising a plurality of reference cells arranged in the column direction,
a first reference bit line connected to each of the first reference cell array and a second reference bit line connected to each of the second reference cell array;
a plurality of bit lines connected to columns of each of the first and second memory cell arrays;
a plurality of word lines connected to rows of each of the first and second cell arrays; and
a sense amplifier shared by the first and second cell arrays and configured to detect data in an accessed memory cell by use of a reference cell,
wherein a predetermined reference cell in the second reference cell array is used to read all the memory cells arranged in the first memory cell array.

13. The memory of claim 12, further comprising:
a row decoder configured to select a word line for the second cell array, configured to connect to the predetermined reference cell.

14. The memory of claim 13, further comprising:
a latch configured to store an address of the predetermined reference cell and to send the address to the row decoder.

15. The memory of claim 14, wherein
the latch comprises a fuse and configured to store the address in a nonvolatile manner depending on whether the fuse is blown.

16. The memory of claim 14, wherein
the latch configured to switch from the predetermined reference cell to a reference cell comprising a reference value within a predetermined range.

17. The memory of claim 13, wherein
the row decoder is configured to select one of the word lines for the first cell array in accordance with an address.

18. The memory of claim 13, wherein
the row decoder comprises a selecting circuit configured to select either an address of the accessed memory cell or an address of the predetermined reference cell.

19. The memory of claim 12, wherein
the variable resistive elements are magnetoresistive elements.

20. The memory of claim 19, wherein
the magnetoresistive elements each comprises a fixed layer comprising a fixed magnetization direction, a recording layer comprising a variable magnetization direction, and a nonmagnetic layer between the fixed layer and the recording layer.

21. The memory of claim 12, wherein
layer structures of the reference cells is substantially the same as layer structures of the variable resistive elements.

22. The memory of claim 12, wherein
a predetermined reference cell in the first reference cell array is used to read all the memory cells arranged in the second memory cell array.

* * * * *